United States Patent [19]
Lasto et al.

[11] Patent Number: 5,553,768
[45] Date of Patent: Sep. 10, 1996

[54] HEAT-CONTROL PROCESS AND APPARATUS FOR ATTACHMENT/DETACHMENT OF SOLDERED COMPONENTS

[75] Inventors: Clifford S. Lasto, Woodbridge; Jeffrey S. Duhaime, Bethany, both of Conn.

[73] Assignee: Air-Vac Engineering Company, Inc., Seymour, Conn.

[21] Appl. No.: 394,138

[22] Filed: Feb. 24, 1995

Related U.S. Application Data

[63] Continuation-in-part of Ser. No. 125,118, Sep. 21, 1993, Pat. No. 5,419,481.

[51] Int. Cl.$^6$ .................. H05K 3/34; B23K 1/00
[52] U.S. Cl. ..................... 228/102; 228/9
[58] Field of Search ............ 228/6.2, 264, 191, 228/4.5, 221, 102, 9, 180.22, 219; 29/834

[56] References Cited

U.S. PATENT DOCUMENTS

| | | | |
|---|---|---|---|
| 4,552,300 | 11/1985 | Zovko et al. | 228/264 X |
| 4,564,135 | 1/1986 | Barresi et al. | 228/6.2 |
| 4,752,025 | 6/1988 | Stach et al. | 228/9 |
| 4,767,047 | 8/1988 | Todd et al. | 228/264 X |
| 4,787,548 | 11/1988 | Abbagnaro et al. | 228/264 X |
| 5,044,072 | 9/1991 | Blais et al. | 228/4.5 X |
| 5,152,447 | 10/1992 | Wallgren et al. | 228/6.2 X |

OTHER PUBLICATIONS

"Rework Fixture For Surface–Mounted Components", IBM Technical Disclosure Bulletin. vol. 29, No. 11, Apr. 1987, pp. 4718–4719.

*Primary Examiner*—J. Elpel
*Attorney, Agent, or Firm*—Perman & Green

[57] ABSTRACT

Process, apparatus and nozzle device for controlling the soldering and/or desoldering of a land grid array (LGA) component and corresponding circuit grid present on the surface of a printed circuit board (PCB). The nozzle device comprises a vacuum cup for supporting the LGA parallel to the PCB, with the LGA and the circuit grid in contact or slightly spaced, a fixed orifice gap for directing hot inlet gas from a gas source horizontally through the array, a gas outlet, and a thermocouple for sensing the temperature of the hot outlet gas and for signaling a computer to actuate a heater and a flow rate regulator. According to a preferred embodiment, this increases the temperature and decreases the flow rate of the hot gas through the array when a predetermined gas outlet temperature is sensed at the thermocouple. Uniform slower circulation of the hotter gas is continued for the desired dwell time to produce uniform, simultaneous melting of the solder array to permit bonding to or desoldering from the circuit array of the PCB while supporting the component parallel to the PCB.

18 Claims, 2 Drawing Sheets

HEAT-CONTROL PROCESS AND APPARATUS FOR ATTACHMENT/DETACHMENT OF SOLDERED COMPONENTS

This application is a continuation-in-part of U.S. Ser. No. 08/125,118, filed Sep. 21, 1993, now U.S. Pat. No. 5,419,481.

BACKGROUND OF THE INVENTION

1. Field of the Invention

The present invention relates to an improved process and apparatus, including improved gas nozzle devices, for sensing and regulating the soldering and desoldering of electrical circuit components to a printed circuit board. More specifically, the present invention relates to improvements or modifications in gas nozzle devices used for the attachment or detachment of electrical circuit components having a land grid array of solder connections to a companion array of circuit connections printed onto the surface of the printed circuit board.

2. State of the Art

A variety of soldering/desoldering machines are known for the attachment and detachment of electrical circuit components from areas of crowded printed circuit boards, adjacent to other closely-spaced soldered components which are not to be disturbed. Reference is made to commonly-assigned U.S. Pat. No. 5,044,072 for its disclosure of such an apparatus, including vacuum gas nozzles for holding an electrical component relative to a PCB surface and for directing hot gas through slots therein downwardly against peripheral component leads and corresponding peripheral solder pads on the PCB. The hot gas melts the solder to permit the attachment or detachment, as desired, of the component relative to the PCB surface.

While such known processes and nozzles produce excellent results with conventional peripheral-lead components, they are not satisfactory for use with face-down or land grid array (LGA) components, including ball grid array (BGA) components, solder grid array (SGA) components, and column grid array (CGA) components. Such components comprise a grid array of spaced solder connections on the undersurface thereof, for electrical connection to a companion array of spaced circuit connections exposed at the upper surface of the printed circuit board. Conventional soldering/desoldering machines and conventional vacuum/gas nozzles are known which apply heated gas at a predetermined fixed temperature and flow rate through a nozzle device, and through a component enclosed thereby, to heat the component body and melt the solder grid array therebeneath. Such known systems have important disadvantages. For example, the applied hot gas does not have a controlled flow path and therefore it can flow from the nozzle against adjacent components on a PCB, causing melting and shorting thereof. Also, since the flow path of the hot gas, such as inert nitrogen gas, is not directed to the area of the solder grid array, the array is melted by indirect heating in the presence of ambient air and oxygen, whereas solder joints formed where an inert atmosphere displaces the ambient air are recognized to be superior.

However, the most important disadvantage of known systems is due to the fact that they are regulated to operate at predetermined fixed temperatures and flow rates, and do not incorporate any means for the automatic adjustment of gas flow rate and/or temperature under changing conditions of use where the pre-set temperature and/or gas flow rate are inadequate or are excessive. For example, at initial start-up the printed circuit board is relatively cold and higher flow rates and/or gas temperatures are required for the soldering operation. However if a plurality of adjacent components are being soldered/desoldered, the successive operations require less heating and may be ineffective unless the apparatus is adjusted each time to regulate the flow rate and/or temperature for the changing conditions of use. Even if this is done, the adjustments must be on the basis of trial by error.

The use of LGA components is growing in view of the advances in technology and the complexity of electrical circuit components which require a greater number of electrical connections which the peripheral area of the component body is not able to accommodate. LGA technology permits a large number of terminal connections to be printed in the form of a grid or array on the undersurface of the component, which connections are hidden beneath the body of the component being attached or detached. The exclusion of peripheral or perimeter leads, extending outwardly from the component, enables components to be mounted in closer proximity to each other, which saves vital PCB surface space or area to enable an increase in component population or a decrease in PCB size.

Copending, commonly-owned U.S. Ser. No. 08/125,118, filed Sep. 21, 1993, now U.S. Pat. No. 5,419,481, enables the uniform heating of the land grid solder array on the undersurface of an LGA component, at the interface with a PCB, by supporting the LGA component relative to the PCB surface, and directing a continuous hot inert gas flow through restricted gas orifices in a supporting nozzle device, under the component and through said land grid solder array, and venting it away therefrom, until all of the solder balls or columns of the array become melted in contact with the corresponding companion array of spaced circuit connections on the upper surface of the PCB. If attachment or soldering of the component to the board is being carried out, the gas flow is discontinued to permit the solder array to resolidify to the PCB contact array. If detachment or desoldering is being carried out, the LGA component is lifted away from the PCB while the solder array is molten. If a new LGA is to be inserted, the PCB melted contact array is prepared and/or new solder materials deposited for the new LGA component. The new LGA component, containing its land grid solder array, is then supported in registration thereon and heated as discussed above.

It is a critical feature of the process and apparatus of said copending application that the solder-melting hot gas is supplied to the underside or multi-contact side of the LGA component from one or more directions, and is withdrawn or permitted to exhaust from one or more opposed directions, whereby a continuous hot gas flow is maintained through all of the spaced solder land islands of the land grid array for a sufficient period of time to produce melting thereof, commonly between about ½ and 2 minutes.

According to the copending application, the flow rate of the hot gas through the spaced solder islands, and the dwell time of the hot gas beneath the LGA component, are controlled by flow meters and length of process time which depends on the type of the device and the printed circuit board characteristics and the temperature of the gas, and/or by Controlling the rate of withdrawal of the hot gas through the gas outlet orifices, in order to produce the necessary melting of all of the spaced solder islands while minimizing dwell time, overheating and solder flow.

Among the problems encountered in attempting to minimize dwell time of the component within the nozzle, during the soldering/desoldering operation, are the sizes of the different nozzles and of the components being attached thereby, the number and size or volume of the spaced solder islands and their composition and melting point, the temperature of the apparatus and/or of the nozzle and/or the PCB, i.e., whether the operation is an initial start-up or a sequential cycle, and other variables which affect the temperature, flow rate and dwell time necessary to optimize the soldering/desoldering operation, while minimizing the impact on surrounding components or assemblies.

SUMMARY OF THE INVENTION

The novel process and apparatus of the present invention involve the steps of controlling the temperature and/or flow rate of a hot gas supply, directing said gas at a flow rate through a component nozzle, under a component supported therein and out one or more opposed hot gas outlets, sensing the temperature of the gas at least one said outlet, which is representative of the gas temperature under said component, and automatically regulating the temperature and/or flow rate of the hot gas before the solder melts in order to control the melt conditions and dwell time, to optimize the soldering/desoldering operation.

DISCUSSION OF THE DRAWINGS

DETAILED DESCRIPTION

In essence, the present invention relates to improvements in the prior-known process, apparatus and hot gas nozzle devices to enable sensing of the temperature of the hot gas melting the solder connections between solder ball or solder column grid arrays present on the face-down or undersurface of land grid array surface components and companion grid array electrical connections present at the upper surface of a printed circuit board, and comprises the step of providing means for directing the inert hot gas flow from a gas supply and through the interfacial space between said LGA undersurface and said PCB, means for venting, discharging or exhausting said gas flow from said space in one or more directions through one or more hot gas outlets, means for sensing the temperature of the exhaust gas at least one said outlet, which is indicative of the temperature of the hot gas in said interfacial space and means for automatically adjusting such as increasing the temperature and such as decreasing the flow rate of said hot gas supply in response to a sensed temperature below the solder melting temperature, whereby a controllable, more gentle flow of hotter gas is maintained between the gas inlet areas and each gas outlet, to melt the entire solder array of the LGA component. Typically, the system is programmed to respond to a predetermined sensed outlet temperature below the solder melt temperature, such as about 170° C. As the melt temperature, is approached and the predetermined activation temperature is reached, the gas flow rate is reduced and the gas temperature is increased, to prevent blowing and disturbing the solder balls as they melt at about 185° C., and to assure that the melting operation is continued to a second predetermined temperature above the solder melt temperature, such as about 205° C., to assure melting of all areas of the array, after which the operation is ceased. Thus each soldering/desoldering operation is regulated in response to its own sensed exhaust temperature, which is independent of other factors such as initial PCB temperature.

Figure 1:
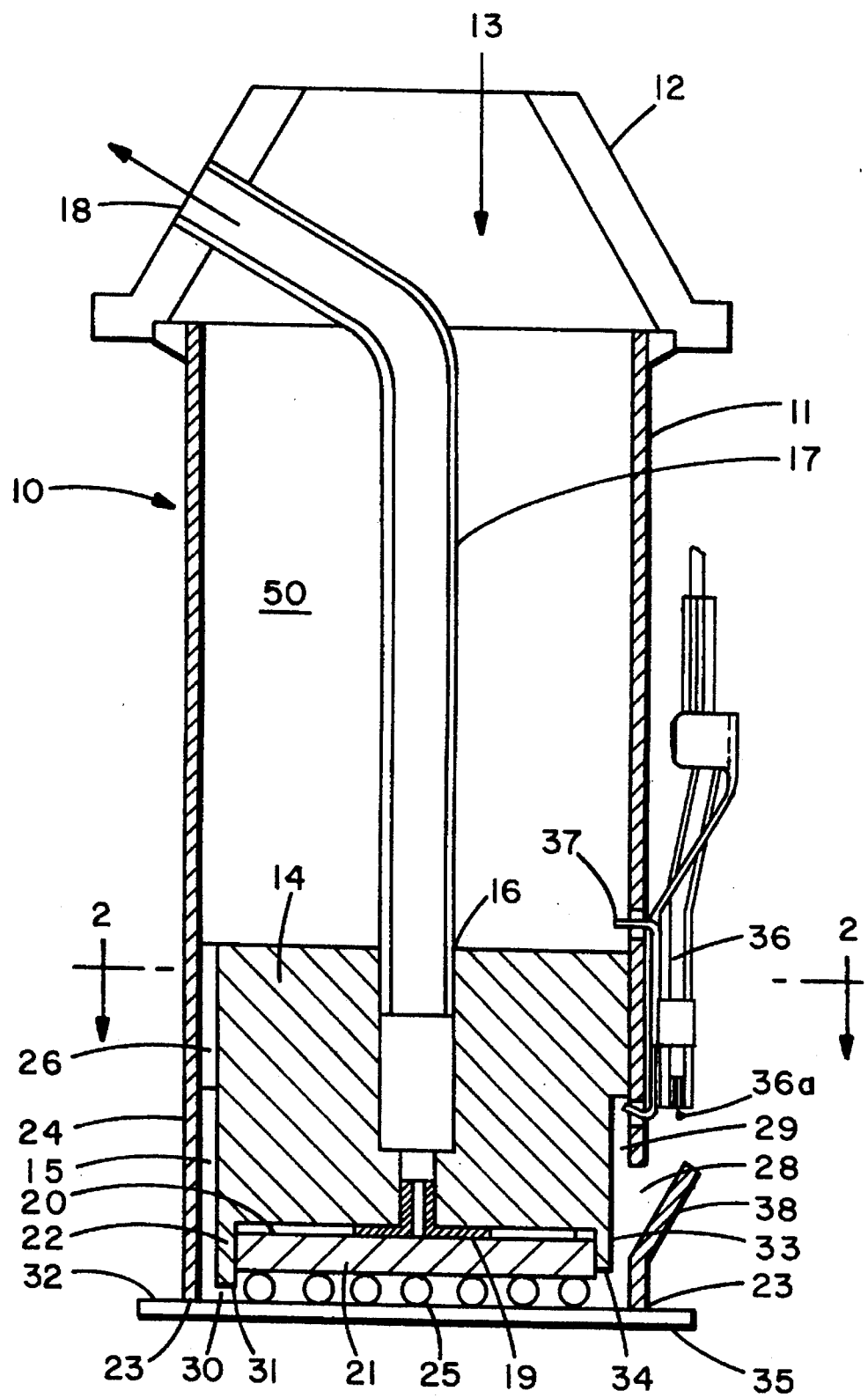
FIG. 1 is a vertical cross-sectional side view of a vacuum/gas nozzle device according to one embodiment of the present invention.

Referring to the drawings, FIG. 1 illustrates a preferred vacuum/gas nozzle device 10 comprising a hollow housing 11 having a rectangular lower wall portion and a cylindrical upper wall portion, enclosing a chamber 50, to which is attached a top cone section 12 which is mountable within the adjustable vacuum/heater head assembly of a surface mount soldering/desoldering apparatus such as disclosed in aforementioned U.S. Pat. No. 5,044,072. The cone section 12 comprises a hot gas cone inlet 13 for receiving temperature-controlled forced hot gas within the hollow housing 11, and a vacuum inlet 18 to the vacuum tube connection 17 for conveying a vacuum to the vacuum suction cup 19 to retain and support the BGA component 21. The nozzle device 10 further comprises a lower block section 14 which seals the lower end of the hollow housing 11 except for three peripheral narrow gas inlet slots 15, 15a and 15b, and a central vacuum bore 16.

The nozzle device 10 is provided with a rigid vacuum tube connection 17 between a passage 18 through the cone section 12 and the bore 16 in the block 14, to permit a vacuum to be drawn through the nozzle device 10 to a component-engaging vacuum suction cup 19 mounted within a lower restricted outlet of the bore 16, at the central ceiling area of the component-receiving compartment or nesting recess 20 within the underside of the block 14. Recess 20 is substantially square as illustrated, and is custom-dimensioned to receive and accommodate a LGA component 21 of predetermined known dimensions so that the sides of the component 21 are closely-spaced from the three inlet walls 22 and the one outlet wall 33 of the recess 20, and so that the depth of the recess 20 from the undersurface of the suction cup 19 to the base 23 of the outer housing wall 24 is substantially the same as, or preferably is up to about 0.03" greater than, the thickness of the LGA component 21 from the upper surface thereof, vacuum-engaged by the suction cup 19, and the undersurfaces of the solder balls 25 of the array. It is preferred to provide the slight spacing of up to about 0.03" to prevent crushing the solder balls and to allow them to settle down onto the solder board connections when the solder joints become molten.

Figure 2:
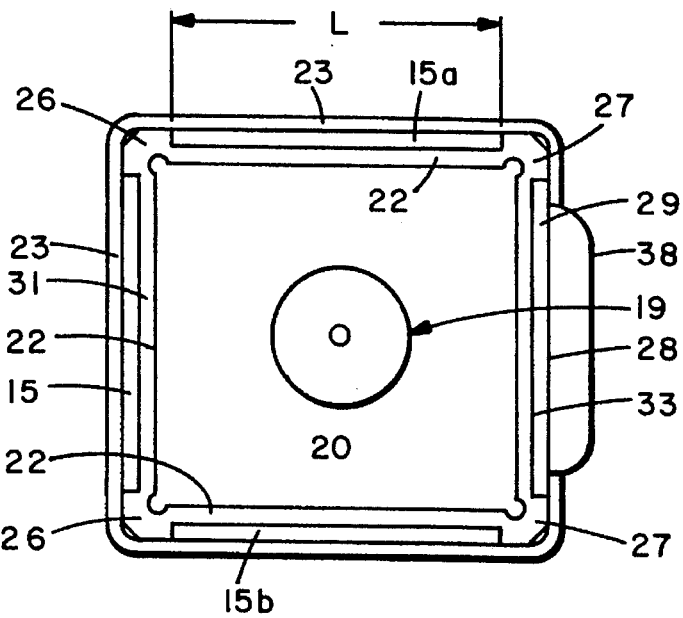
FIG. 2 is a horizontal cross-sectional view of the lower block section of the nozzle device of FIG. 1.

As illustrated by FIG. 2, the lower block section 14 which seals the lower end of the nozzle housing 11 is connected to the housing 11 at corner connections 26 and at an elongate side connection 27 to the side wall 24 of the housing 11 which contains an elongate gas-outlet port 28 opening from a gas-outlet slot 29 formed between the wall 24 and the block section 14 for discharge of the hot outlet gas against an upwardly-inclined gas-deflecting outer wall portion 39. The hot gas inlet slots 15, 15a and 15b are narrow and elongate, having a length "L" as shown in FIG. 2, and slots 15a and 15b may be uniform width, as shown, or may be tapered or narrowed or shortened in the direction of the gas outlet slot 29 if necessary to aid in making the temperature of the solder joints uniform and prevent overheating of the solder balls 25 at the corners of the component 21 nearest the slot 29.

Another important feature of the present nozzle devices 10 according to the embodiment of FIG. 1 is that the width of the elongate horizontal hot gas inlet orifices 30 is fixed to equal the difference between the length of the outer housing wall 24, to the base 23 thereof, and the length of the component-nesting inlet recess walls 22, to the base 31 thereof. Thus, the width of the peripheral elongate gas-inlet orifices 30, to which the three gas inlet slots 15, 15a and 15b open, is uniform and fixed when the base 23 of the outer wall 24 is seated against the surface of the printed circuit board 32. The outlet side-wall 33 of the component recess 20 shown in FIG. 1 is shorter than the inlet walls 22 and provides a wider elongate horizontal outlet orifice 35 between the base 34 thereof and the base 23 of the outer housing wall 24, opening to the outlet slot 29 and gas outlet port 28 at the outlet side of the nozzle device. However, this is not essential.

Figure 3:
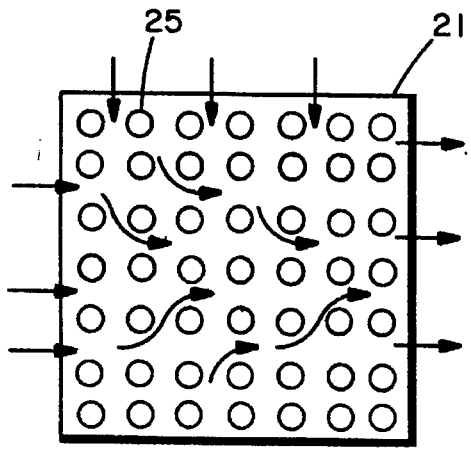
FIG. 3 is an illustration of the hot gas flow inlet and exhaust paths through a solder ball array, as provided by the nozzle device of FIG. 1.

The supply of hot gas through the cone inlet and through the three gas inlet slots 15, 15a and 15b is restricted by the narrow width of the horizontal gas inlet orifices 30 and flows at increased velocity from three directions, between and around the individual solder balls 25 of the array on the undersurface of component 21, as illustrated in FIG. 3 by means of small arrows, and is forced and/or vacuum-drawn outwardly therefrom through the wider outlet orifice 35 and the outlet port 28 and against deflector wall portion 38 at the outlet side of the nozzle device, as illustrated by large arrows in FIG. 3.

As mentioned, slots 15, 15a and 15b, illustrated by FIG. 2, can be narrowed, tapered or shortened to restrict the flow of the hot gas from the areas of these slots closest to the outlet port 28, thereby unifying the dwell time of the hot gas in all areas of the solder ball array and producing a more uniform heating of all areas thereof.

As illustrated by FIG. 1, the gas outlet port 28 in housing wall 24 is spaced upwardly, away from the base 23 thereof, to cause all of the hot outlet gas to flow upwardly against or over deflector wall 38 and away from the surface of the PCB and preclude the possible melting or damaging of adjacent components and/or solder connections thereon. Furthermore, the sensor 36a of a thermocouple 36 is associated with the outlet 28 and the deflector wall 38, mounted on the outer surface of wall 24 by an insulated bracket 37, whereby the temperature of the hot gas outlet flow is sensed and used to regulate the process parameters including gas flow rate, gas temperature and cycle time and provide real-time process control feedback. A vacuum outlet-assist means may be particularly useful in cases where the solder ball array comprises a dense array of small-diameter balls 25 through which it may be difficult for the hot gas to be forced without vacuum-assisted withdrawal.

The present thermocouple means 36, comprises a heat-sensitive element such as a thermocouple wire which operates on the principle of increased voltage with increasing temperature whereby the voltage is correlated to the temperature thereof. The temperature of the hot gas exiting the outlet 28 is indicative of the temperature of the hot gas flowing through the solder ball array 25 on the undersurface of the component 21. As the sensed temperature at outlet 28 approaches a predetermined actuation temperature, below the melting temperature of the solder balls 25, the flow rate of the hot gas is reduced and the temperature thereof is increased. The cycle is discontinued when the sensed temperature reaches a predetermined final temperature. This prevents the application of an excessive flow force during a soldering or desoldering operation, while assuring that adequate heat continues to be applied to melt all of the solder balls. Generally, the thermocouple 36, which comprises a junction of two different wires which accomplish a net conversion of thermal energy into electrical energy with the appearance of a corresponding current flow, is integrated with a computer associated with an adjustable flow meter and gas heater to automatically decrease the flow rate and raise the temperature when the predetermined exit temperature is sensed.

Figure 4:
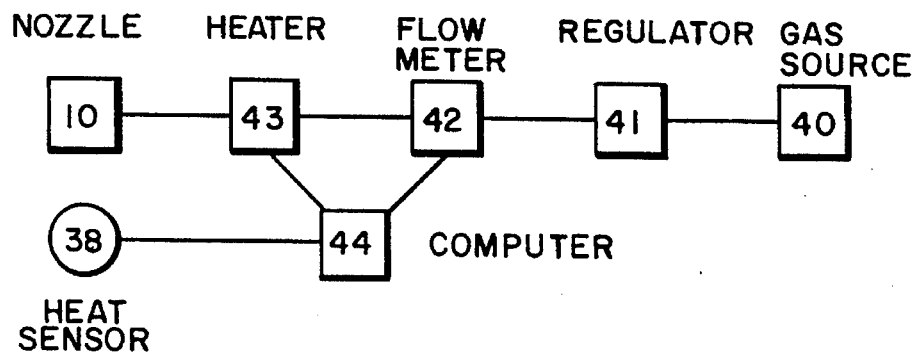
FIG. 4 is a flow diagram illustrating various components which are electrically-connected for the automatic control of the heated gas flow through the present nozzle devices.

As illustrated by the flow diagram of FIG. 4, the hot gas to inlet 13 of the nozzle 10 is supplied from a gas source 40, such as a tank of liquid nitrogen, through a pressure regulator 41 to maintain a predetermined gas pressure. The pressure-regulated gas is then passed through an adjustable electronic flow meter 42 set to an initial or start-up flow rate. The gas then flows through an adjustable electronic gas heater 43 set to an initial or start-up gas temperature.

A microprocessor or computer 44 is electrically-connected to the flow regulator 42 and also to the gas heater 43 and to the thermocouple 36 which senses the temperature of the outlet gas from the nozzle device 10 and which is pre-set to signal the computer 44, when the predetermined actuation temperature is reached, such as about 170° C., which is below the solder melting temperature of about 183° C.

At the actuation temperature, the computer 44 signals the gas flow regulator or meter 42 to reduce the gas flow to a predetermined desired level below that at which the force of the gas might cause the solder balls to flow together as they liquify when they reach their melting temperature. Simultaneously, the computer 44 signals the gas heater 43 to a higher temperature, to compensate for the reduced flow rate of the hot gas and to assure that the temperature of the hot gas in the area of the solder ball array continues to rise to the solder melting temperature and beyond. When a predetermined final temperature of about 205° C. is sensed by the thermocouple 36, the computer 44 is given a second signal to deactivate the heater 43 and the flow regulator 42 and/or to discontinue the gas supply 40 to end the cycle. The elevated final temperature assures that all of the solder balls have been melted, for uniformity of results.

The system is pre-set or programmed for start-up conditions for the heater 43 and the flow regulator 42 to produce an initial supply of gas to inlet 13 at a predetermined temperature and flow rate, while the thermocouple sensor 36a is sensing a temperature at gas outlet 28. As the gas outlet temperature increases and reaches the predetermined actuation temperature, such as 170° C. the thermocouple 36 signals the computer 44 to reduce the gas flow rate at flow regulator 42, and increase the gas temperature at heater 43 from source 40 to inlet 13 during the melting phase. Finally, as soon as the final temperature of about 205° C. is sensed by thermocouple sensor 36a, the programmed computer 44 is signalled to discontinue gas flow from supply 40 until the next soldering/desoldering cycle.

It will be apparent to those skilled in the art that the present temperature-sensing- apparatus preferably is computer program-controlled and automatically-adjustable to accommodate solder compositions having different melting temperatures and/or to provide variable flow rates and dwell times. In most instances it is desirable to use hot inert gas and a high initial flow rate and temperature, to minimize the dwell time of the component 21 within the nozzle device 10 and minimize the cycle time or period of time that the component is exposed to the high heat and/or to minimize the duration of heating of adjacent components on the PCB. These variables can be programmed into the computer means 44 to enable automatic selection of the desired conditions of operation to produce the desired results in cooperation with the thermocouple 36.

The present nozzles 10 of FIG. 1 are precision dimensioned to support an LGA component 21 in alignment over the surface of the PCB 32 so that the undersurfaces of the solder balls 25 lightly engage or, more preferably, are slightly spaced above the contact areas of the PCB by a distance less than about 0.03". This prevents crushing and spreading of the solder balls during the melting step. With the nozzle 10 of FIG. 1, in which the lower section of the housing wall 24 forms a skirt, the base 23 of which engages the surfaces of the PCB 32, the component 21 is automatically supported in the desired position provided that the depth of the recess 20 is properly machined so that the distance between the undersurface of the vacuum cup 19 and the surface of the PCB 32 corresponds to, or is slightly greater than, the thickness of the component 21 from the upper surface thereof to the undersurfaces of the solder balls 25.

In certain soldering/desoldering machines, such as that of aforementioned U.S. Pat. No. 5,044,072, the vertical positioning means may be calibrated so that the proper stop positions for different nozzles 10 may be predetermined and recorded.

It will be apparent to those skilled in the art that a number of different operational parameters of the present nozzle devices can be varied in relative relationship to each other in order to vary the results produced. Thus, the relative widths and overall lengths of the gas-inlet orifice and gas-outlet orifice are important and can be altered, relative to each other, to provide nozzle devices having different flow patterns through the solder ball array. The length "L" and tapering of the inlet slots 15, 15a and 15b and of the outlet 28 can be varied, and the nature of the thermocouple 36, or other temperature-variation sensor and signal means, its exact location and its support system can be varied to produce the desired automatic control of the flow rates and/or temperatures of the hot gas to provide the desired uniform and simultaneous melting of the solder balls or columns at controlled maximum temperatures, gas flow rates and desired dwell times.

The vacuum retention of the LGA components within the recess of the present nozzle devices, parallel to the PCB, supports the solder array in surface contact with, or slightly above, the circuit array on the PCB, and the suction cup permits some flexible movement of the component if solder coplanarity is not perfect. Also the vacuum retention of the component prevents any tilting or sagging of the component when melting of the solder array occurs.

Each of the present unitary nozzle devices is precision manufactured to accommodate LGA components of a specific size or type. Thus the dimensions of the component-receiving recess are such as to firmly retain the LGA component therein, providing a small clearance, and to prevent the undersurface of the solder ball array of a retained component from crushing and spreading of the solder balls against the PCB surface when melting occurs.

The use of the present nozzle devices in association with a hot gas soldering/desoldering apparatus of the type disclosed in aforementioned U.S. Pat. No. 5,044,072 reduces any risk of misalignment of the LGA/component relative to the circuit array on the PCB, alleviates process problems and simplifies operation procedures for the soldering and/or desoldering of land grid array components including solder bump array components, micro ball grid arrays, ball grid array components, column grid array components and other components having partially or completely hidden solder connections such as flip chips, direct die attachment and leaded and leadless chip carriers, both ceramic and plastic. Such soldering/desoldering apparatus comprises a releasable clamping means for receiving and engaging the top cone section of each nozzle device within the adjustable vacuum/ hot gas heater head assembly, for supplying vacuum through the nozzle device to retain the component, and for supplying hot gas through the aligned nozzle device at the desired temperatures and flow rates, in response to signals from the thermocouple to the programmed computer, during the soldering or desoldering cycles of operation.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A unitary vacuum/hot gas nozzle device for supporting an electrical component, having a meltable solder lead array on the undersurface thereof, in contact with or closely-spaced above a corresponding circuit array present on the surface of a printed circuit board, and for directing a continuous flow of hot gas from a gas source at a predetermined temperature and flow rate to circulate through said solder lead array and melt said solder leads uniformly and substantially simultaneously, said nozzle device comprising a housing having an upper wall section enclosing an internal hot gas chamber and a lower wall section enclosing a block member having a central component-supporting recess in the undersurface thereof, vacuum conduit means, through said housing and block member to said recess, to retain a said component within said recess, inlet means for receiving hot gas into said hot gas chamber, means for channeling the hot gas from said chamber to at least a portion of the outer periphery of said recess, a narrow hot gas orifice for directing said channeled hot gas horizontally in at least one direction through the meltable solder lead array on the undersurface of a component retained by said vacuum means within said recess, at least one hot gas outlet for venting the hot gas which has passed through said solder lead array, and a temperature sensing means associated with said outlet and with the gas source for actuating changes in the temperature or flow rate of the hot gas, to adjust the temperature or the flow rate of the hot gas through the meltable solder lead array and produce uniform and gradual melting thereof while the component is retained in said recess for the desired dwell time, with the solder lead array adjacent or bonded to a corresponding circuit array present on the surface of a printed circuit board.

2. A nozzle device according to claim 1 in which the temperature sensing means comprises a thermocouple electrically-connected with a computer means which is connected with a means for controlling the temperature and the flow rate of the hot gas from the gas source, to increase the temperature and reduce the flow rate of the hot gas through the nozzle device in response to a predetermined outlet gas temperature sensed by the thermocouple.

3. A nozzle device according to claim 2 in which said thermocouple is mounted on the lower wall section of the housing for support in the path of the hot gas exiting the hot gas outlet.

4. A nozzle device according to claim 3 in which the lower wall section of the housing, adjacent the hot gas outlet, comprises a deflector means for directing the path of hot gas exiting the gas outlet upwardly against said thermocouple.

5. A nozzle device according to claim 1 in which said housing has a top cone section having an inlet opening to said vacuum conduit means, and another inlet opening comprising said gas inlet means for receiving hot gas into said hot gas chamber.

6. A nozzle device according to claim 1 in which said vacuum conduit means terminates in a vacuum suction cup within said component-supporting recess, for vacuum engagement with said component.

7. A nozzle device according to claim 1 in which the lower wall section of the housing is of sufficient length to contact the upper surface of a printed circuit board, and the depth of the component-supporting recess is predetermined for each supported component so that the undersurface of the solder array thereof engages or is slightly spaced above the surface of the corresponding circuit array on the printed circuit board when said lower wall section is in contact with the surface of the printed circuit board.

8. A nozzle device according to claim 1 in which each said hot gas outlet comprises an opening in the lower wall section of the housing, spaced upwardly, away from a base of said wall section, for venting the hot gas upwardly away from the surface of a printed circuit board.

9. Process for controlling the uniform, substantially-simultaneous melting of the leads of a solder lead array present on the undersurface of an electrical component while said array is in contact with or spaced slightly above, or is bonded to a corresponding circuit array present on the surface of a printed circuit board, comprising supporting said component parallel to the printed circuit board surface with said solder lead array and said circuit array aligned in contact or slightly spaced, introducing a continuous flow of hot gas from a gas source through a narrow orifice gap and horizontally through said solder lead array in at least one direction, and exhausting said hot gas from said array through at least one hot gas outlet, sensing the temperature of said hot gas at said outlet, and adjusting the temperature or the flow rate of said hot gas from the gas source through said solder lead array at a predetermined temperature below the melting point of the solder, for the necessary dwell time to produce the desired uniform and simultaneous melting of said solder lead array and permit bonding to or separation from the circuit array on said printed circuit board while said component is supported parallel to the surface of the printed circuit board.

10. Process according to claim 9 which comprises sensing the hot gas temperature at the hot gas outlet by means of a thermocouple electrically-connected to a control means which is connected with a means for heating the gas from said gas source, and with a means for controlling the flow rate of the gas from said gas source, to automatically increase the temperature and reduce the flow rate of the hot gas through the solder lead array in response to a predetermined temperature sensed at the hot gas outlet.

11. Process according to claim 9 which comprises supporting said electrical component by means of vacuum within a recess enclosure surrounded by peripheral walls.

12. Process according to claim 11 comprising engaging said peripheral walls with the surface of the printed surface board to retain the supported component uniformly spaced from the surface of the printed circuit board during melting of the solder lead array, thereby preventing crushing of the solder lead array.

13. Process according to claim 9 which comprises locating each said hot gas outlet upwardly away from the surface of the printed circuit board to direct the hot outlet gas away from adjacent electrical components present on the printed circuit board.

14. Process according to claim 9 which comprises locating an upwardly inclined deflector wall at the exit of each said hot gas outlet to deflect the path of the hot gas from said outlet upwardly, away from the surface of the printed circuit board.

15. A soldering/desoldering apparatus comprising a means for supplying a continuous flow of gas, flow rate-regulating means for said gas, heater means for said gas, means for controlling said flow rate-regulating and said heater means, and a unitary vacuum/hot gas nozzle device for supporting an electrical component, having a meltable solder lead array on the undersurface thereof, in contact with or closely-spaced above a corresponding circuit array present on the surface of a printed circuit board, and for directing a continuous flow of said gas from said supply means at a predetermined temperature and flow rate to circulate through said solder lead array and melt said solder leads uniformly and substantially simultaneously, said nozzle device comprising a housing having an upper wall section enclosing an internal hot gas chamber and a lower wall section enclosing a block member having a central component-supporting recess in the undersurface thereof, vacuum conduit means, through said housing and block member to said recess, to retain a said component within said recess, inlet means for receiving the hot gas into said hot gas chamber, means for channeling the hot gas from said chamber to at least a portion of the outer periphery of said recess, a narrow hot gas orifice for directing said channeled hot gas horizontally in at least one direction through the meltable solder lead array on the undersurface of a component retained by said vacuum means within said recess, at least one hot gas outlet for venting the hot gas which has passed through said solder lead array, and a temperature sensing means associated with said outlet and with said control means for automatically actuating said flow regulating means and said heater means, to adjust the temperature or the flow rate of hot gas through the meltable solder lead array at a predetermined sensed temperature below the melting temperature of the solder lead array, to produce uniform and gradual melting thereof while the component is retained in said recess for the desired dwell time, with the solder lead array adjacent to or bonded to a corresponding circuit array present on the surface of a printed circuit board.

16. Apparatus according to claim 15 in which said control means comprises a computer which is programmed for the automatic actuation of said flow regulating means and said heater means in response to a signal from said temperature-sensing means.

17. Apparatus according to claim 15 in which said temperature-sensing means comprises a thermocouple.

18. Apparatus according to claim 15 in which the lower wall section of the nozzle device comprises a hot gas deflector means at the hot gas outlet for deflecting the hot outlet gas upwardly, away from the printed circuit board and against said temperature-sensing means.

* * * * *